(12) United States Patent
Nguyen et al.

(10) Patent No.: US 12,614,982 B2
(45) Date of Patent: Apr. 28, 2026

(54) DUAL-PATH CHARGE PUMP

(71) Applicant: Silicon Storage Technology, Inc., San Jose, CA (US)

(72) Inventors: Nghia Nguyen, Ho Chi Minh (VN); Hien Lai, Ho Chi Minh (VN); Thoan Nguyen, Dong Nai (VN); Son Nguyen, Ho Chi Minh (VN); Viet Nguyen, Ho Chi Minh (VN)

(73) Assignee: Silicon Storage Technology, Inc., San Jose, CA (US)

( * ) Notice: Subject to any disclaimer, the term of this patent is extended or adjusted under 35 U.S.C. 154(b) by 378 days.

(21) Appl. No.: 18/109,397

(22) Filed: Feb. 14, 2023

(65) Prior Publication Data

US 2024/0171069 A1 May 23, 2024

Related U.S. Application Data

(60) Provisional application No. 63/427,398, filed on Nov. 22, 2022.

(51) Int. Cl.
H02M 3/07 (2006.01)
G11C 5/14 (2006.01)

(52) U.S. Cl.
CPC ............. H02M 3/076 (2021.05); G11C 5/145 (2013.01)

(58) Field of Classification Search
None
See application file for complete search history.

(56) References Cited

U.S. PATENT DOCUMENTS

| | | | | |
|---|---|---|---|---|
| 5,029,130 | A | 7/1991 | Yeh | |
| 6,747,310 | B2 | 6/2004 | Fan et al. | |
| 7,301,388 | B2 * | 11/2007 | Kim | G11C 5/145 |
| | | | | 363/59 |
| 7,317,347 | B2 * | 1/2008 | Mensi | G05F 1/10 |
| | | | | 363/59 |
| 7,679,429 | B2 * | 3/2010 | Nakamura | H02M 3/073 |
| | | | | 363/59 |

(Continued)

FOREIGN PATENT DOCUMENTS

| | | |
|---|---|---|
| CN | 114 157 141 A | 3/2022 |
| EP | 0852799 B1 | 4/2002 |

OTHER PUBLICATIONS

PCT Search Report and Written Opinion mailed on Jul. 7, 2023 corresponding to the related PCT Patent Application No. PCT/US2023/013837.

(Continued)

*Primary Examiner* — Thomas J. Hiltunen
(74) *Attorney, Agent, or Firm* — Vedder Price P.C.

(57) ABSTRACT

Examples of improved charge pumps are disclosed. In one example, a system comprises a first charge path comprising a first stage to boost an input voltage and a second stage to boost a voltage received from the first stage of the first charge path; and a second charge path comprising a first stage to boost an input voltage and a second stage to boost a voltage received from the first stage of the second charge path; wherein an output of the second stage of the first charge path is coupled to the first stage of the second charge path and an output of the second stage of the second charge path is coupled to the first stage of the first charge path.

18 Claims, 11 Drawing Sheets path 901

Charge Pump
900

VOUT path 951 901-0 901-1 901-(I-1) 901-i

Stage 0    Stage 1       Pre-out stage    Output stage

(56)        References Cited

U.S. PATENT DOCUMENTS

| | | | | |
|---|---|---|---|---|
| 7,777,557 | B2 * | 8/2010 | Yamahira | G11C 5/145 |
| | | | | 327/536 |
| 8,232,833 | B2 * | 7/2012 | Tran | H02M 3/073 |
| | | | | 363/60 |
| 9,509,213 | B1 * | 11/2016 | Yuan | H02M 3/07 |
| 10,374,512 | B2 * | 8/2019 | Szczeszynski | H02M 3/073 |
| 11,342,844 | B1 * | 5/2022 | Meyvaert | H02M 3/158 |
| 11,563,373 | B2 * | 1/2023 | Rana | G11C 16/30 |
| 12,166,422 | B2 * | 12/2024 | Meyvaert | H02J 1/082 |
| 2003/0090311 | A1 | 5/2003 | Pan et al. | |
| 2003/0184360 | A1 * | 10/2003 | Wang | H02M 3/073 |
| | | | | 327/536 |
| 2004/0263238 | A1 | 12/2004 | Thorp et al. | |
| 2005/0264343 | A1 | 12/2005 | Nakamura | |
| 2022/0158550 | A1 | 5/2022 | Rana et al. | |

OTHER PUBLICATIONS

Oi-Ying Wong et al., "An Overview of Charge Pumping Circuits for Flash Memory Applications," pp. 116-119, Oct. 25, 2011, 2011 IEEE 9th International Conference.

Taiwanese Office Action mailed on Jul. 31, 2024 corresponding to the related Taiwanese Patent Application No. 112141160. (Google English Translations and original copy of the Taiwanese Office Action are attached.).

Machine translation of Office Action from Korea Patent Office, dated Aug. 27, 2025, filed under Korea Patent Application No. 10-2025-7006212, 9 pages.

Machine translation of Office Action from Taiwan Patent Office, Aug. 20, 2025, filed under Taiwan Patent Application No. 114125582, 5 pages.

* cited by examiner memory cell
210

Clock Timing Diagrams
700

Stage N          Stage N+1

Clock Diagram
1000

DUAL-PATH CHARGE PUMP

PRIORITY CLAIM

This application claims priority from U.S. Provisional Patent Application No. 63/427,398, filed on Nov. 22, 2022, and titled "Dual-Path Charge Pump With Cross-Feedback," which is incorporated by reference herein.

FIELD OF THE INVENTION

An improved charge pump that utilizes a dual path and cross-feedback between stages and paths is disclosed.

BACKGROUND OF THE INVENTION

Non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 110 is shown in FIG. 1. Each memory cell 110 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 110 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim (FN) tunneling.

Memory cell 110 is programmed by source side injection (SSI) with hot electrons (where electrons are placed on the floating gate) by placing a positive voltage on the word line terminal 22, and a positive voltage on the source region 14. Electron current will flow from the drain region 16 towards the source region 14. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 110 is read by placing positive read voltages on the drain region 16 and word line terminal 22 (which turns on the portion of the channel region 18 under the word line terminal). If the floating gate 20 is positively charged (i.e., erased of electrons), then the portion of the channel region 18 under the floating gate 20 is turned on as well, and current will flow across the channel region 18, which is sensed as the erased or "1" state. If the floating gate 20 is negatively charged (i.e., programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage and current ranges that can be applied to the terminals of memory cell 110 for performing read, erase, and program operations:

TABLE No. 1

| Operation of Flash Memory Cell 110 of FIG. 1 | | | |
|---|---|---|---|
| | WL | BL | SL |
| Read | 2-3 V | 0.6-2 V | 0 V |
| Erase | ~11-13 V | 0 V | 0 V |
| Program | 1-2 V | 10.5-3 µA | 9-10 V |

Other split gate memory cell configurations, which are other types of flash memory cells, are known. For example, FIG. 2 depicts a four-gate memory cell 210 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage and current ranges that can be applied to the terminals of memory cell 210 for performing read, erase, and program operations:

TABLE No. 2

| Operation of Flash Memory Cell 210 of FIG. 2 | | | | |
|---|---|---|---|---|
| | WL/SG | BL | CG | EG | SL |
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 0.1-1 µA | 8-11 V | 4.5-9 V | 4.5-5 V |

FIG. 3 depicts a three-gate memory cell 310, which is another type of flash memory cell. Memory cell 310 is identical to the memory cell 210 of FIG. 2 except that memory cell 310 does not have a separate control gate. The erase operation (whereby erasing occurs through use of the erase gate) and read operation are similar to that of the FIG. 2 except there is no control gate bias applied. The programming operation also is done without the control gate bias, and as a result, a higher voltage is applied on the source line during a program operation to compensate for a lack of control gate bias.

Table No. 3 depicts typical voltage and current ranges that can be applied to the terminals of memory cell 310 for performing read, erase, and program operations:

TABLE No. 3

| Operation of Flash Memory Cell 310 of FIG. 3 | | | |
|---|---|---|---|
| | WL/SG | BL | EG | SL |
| Read | 0.7-2.2 V | 0.6-2 V | 0-2.6 V | 0 V |
| Erase | −0.5 V/0 V | 0 V | 11.5 V | 0 V |
| Program | 1 V | 0.2-3 µA | 4.5 V | 7-9 V |

FIG. 4 depicts stacked gate memory cell 410, which is another type of flash memory cell. Memory cell 410 is similar to memory cell 110 of FIG. 1, except that floating gate 20 extends over the entire channel region 18, and control gate 22 (which here will be coupled to a word line)

extends over floating gate 20, separated by an insulating layer (not shown). The erase is done by FN tunneling of electrons from FG to substrate, programming is by channel hot electron (CHE) injection at region between the channel 18 and the drain region 16, by the electrons flowing from the source region 14 towards to drain region 16 and read operation which is similar to that for memory cell 210 with a higher control gate voltage.

Table No. 4 depicts typical voltage ranges that can be applied to the terminals of memory cell 410 and substrate 12 for performing read, erase, and program operations:

TABLE No. 4

| Operation of Flash Memory Cell 410 of FIG. 4 | | | |
| --- | --- | --- | --- |
| | CG | BL | SL | Substrate |
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferro-electric ram), CT (charge trap) memory, CN (carbon-tube) memory, OTP (bi-level or multi-level one time programmable), and CeRAM (correlated electron ram), without limitation.

FIG. 5 depicts a block diagram of prior art memory system 500. Memory 500 comprises array 501, row decoder 502, high voltage decoder 503, column decoders 504, bit line drivers 505, input circuit 506, output circuit 507, control logic 508, and bias generator 509. Memory system 500 further comprises high voltage generation block 510, which comprises charge pump 511, charge pump regulator 512, and high voltage level generator 513. Memory system 500 further comprises (program/erase, or weight tuning) algorithm controller 514, analog circuitry 515, control engine 516 (that may include special functions such as arithmetic functions, activation functions, embedded microcontroller logic, without limitation), test control logic 517, and SRAM block 518 to store intermediate data such as for input circuits (e.g., activation data) or output circuits (neuron output data) or data in for programming (such as data in for whole row or multiple rows).

Array 501 comprises rows and columns of non-volatile memory cells, such as memory cells 110, 210, 310, or 410 from FIGS. 1-4, respectively.

The input circuit 506 may include circuits such as a DAC (digital to analog converter), DPC (digital to pulses converter, digital to time modulated pulse converter), AAC (analog to analog converter, such as a current to voltage converter, logarithmic converter), PAC (pulse to analog level converter), or any other type of converters. The input circuit 506 may implement one or more of normalization, linear or non-linear up/down scaling functions, or arithmetic functions. The input circuit 506 may implement a temperature compensation function for input levels. The input circuit 506 may implement an activation function such as ReLU or sigmoid. Input circuit 506 may store digital activation data to be applied as or combined with an input signal during a program or read operation. The digital activation data can be stored in registers. Input circuit 506 may comprise circuits to drive the array terminals, such as CG, WL, EG, and SL lines, which may include sample-and-hold circuits and buffers. A DAC can be used to convert digital activation data into an analog input voltage to be applied to the array.

The output circuit 507 may include circuits such as an ITV (current-to-voltage circuit), ADC (analog to digital converter, to convert neuron analog output to digital bits), AAC (analog to analog converter, such as a current to voltage converter, logarithmic converter), APC (analog to pulse(s) converter, analog to time modulated pulse converter), or any other type of converters. The output circuit 507 may convert array outputs into activation data. The output circuit 507 may implement an activation function such as rectified linear activation function (ReLU) or sigmoid. The output circuit 507 may implement one or more of statistic normalization, regularization, up/down scaling/gain functions, statistical rounding, or arithmetic functions (e.g., add, subtract, divide, multiply, shift, log) for neuron outputs. The output circuit 507 may implement a temperature compensation function for neuron outputs or array outputs (such as bitline output) so as to keep power consumption of the array approximately constant over temperature or to improve precision of the array (neuron) outputs such as by keeping the IV slope approximately the same over temperature. The output circuit 507 may comprise registers for storing output data.

Charge pump 511 must generate the high voltages needed for erase and program operations, such as those shown in Table Nos. 1-4 above, from a supply voltage that typically is between 1.5-3.0 V.

FIG. 6 depicts prior art charge pump 600. Prior art charge pump 600 comprises i+1 stages, which are stages 601-0 (stage 0), 601-1 (stage 1), . . . 601-(i−1) (pre-out stage), and 601-i (output stage). Prior art charge pump 600 also comprises a dual path, specifically, path 601 and path 651. Each stage boosts its received input voltage and outputs the boosted voltage to the next stage as the input voltage for the next stage, or in the case of stage 601-i, as the output Vout of charge pump 600. Paths 601 and 651 operate out of phase with one another, such that the output, Vout, is always at the maximum boosted voltage.

FIG. 7 depicts examples of clock timing diagrams for clock signals CK1, CK2, CK3, and CK4 used in charge pump 600. Clocks signals CK1, CK2, CK3, and CK4 are generated from a common clock signal, denoted CLK. Clock signals CK2 and CK3 are complements of each other, and clock signals CK1 and CK4 are complements of each other. Thus, CK2 and CK3 are complementary clock signals and CK1 and CK4 are complementary clock signals. A respective edge of clock signals CK2 and CK3 are delayed from a respective first edge of common clock signal CLK by an amount Tdelay1. A respective edge of clock signals CK1 and CK4 are delayed from a respective second edge of common clock signal CLK by an amount Tdelay2.

FIG. 8 depicts two example stages for one of the paths in charge pump 600, here shown as stage N and stage N+1. Each stage in each path in charge pump 600 performs the boost operation in the same manner, which will explained with reference to stage N+1. Node C is the input voltage received by stage N+1. CK3 and CK4 are clock signals as shown in FIG. 7 and are coupled to capacitors 804 and 805, respectively. When CK3 goes high, the voltage on the top plate of capacitor 804, which is node C, is boosted by the amount of the voltage by which CK3 increased. There is a delay period, Tdelay2, between a rising edge of CK3 and a rising edge of CK4 as shown in FIG. 7, and this delay will utilize a higher potential on node C to pre-charge node B through MB_T2 by the amount of VOUT minus $V_{TH}$ of MB_T2. When CK4 goes high, the voltage on the top plate of capacitor 805, which is node B, is boosted by the amount of the voltage by which CK4 increased. As a result, the potential on node B now becomes extremely high due to the pre-charge period and the boost by CK4. The higher potential on node B helps transfer the charge from node C to VOUT through transistor 804. Transistor 806 can be enabled to place VOUT at an initial voltage of VDD, or it can remain enabled throughout operation of charge pump 600 to provide a floor for the value of VOUT (VOUT will always be equal to or exceed VDD).

One drawback of prior art charge pump 600 is that the body effect will increase the threshold voltages, $V_{TH}$, of transistors 801 (MB_T1), 802 (MS T1), 803 (MB_T2), and 804 (MS_T2). Given the configuration of charge pump 600, the voltages that are provided to the gates of those transistors may not be large enough to exceed the increased $V_{TH}$ and fully turn on those transistors. This problem becomes more pronounced with each subsequent stage.

An improved charge pump is needed.

SUMMARY OF THE INVENTION

An improved charge pump is disclosed. The charge pump uses a dual path topology.

Cross-feedback is provided between paths such that the high voltage generated by a stage (N+1) in one path is applied to gates of transistors of the previous stage (N) of the other path.

DETAILED DESCRIPTION OF THE INVENTION

Figure 9:
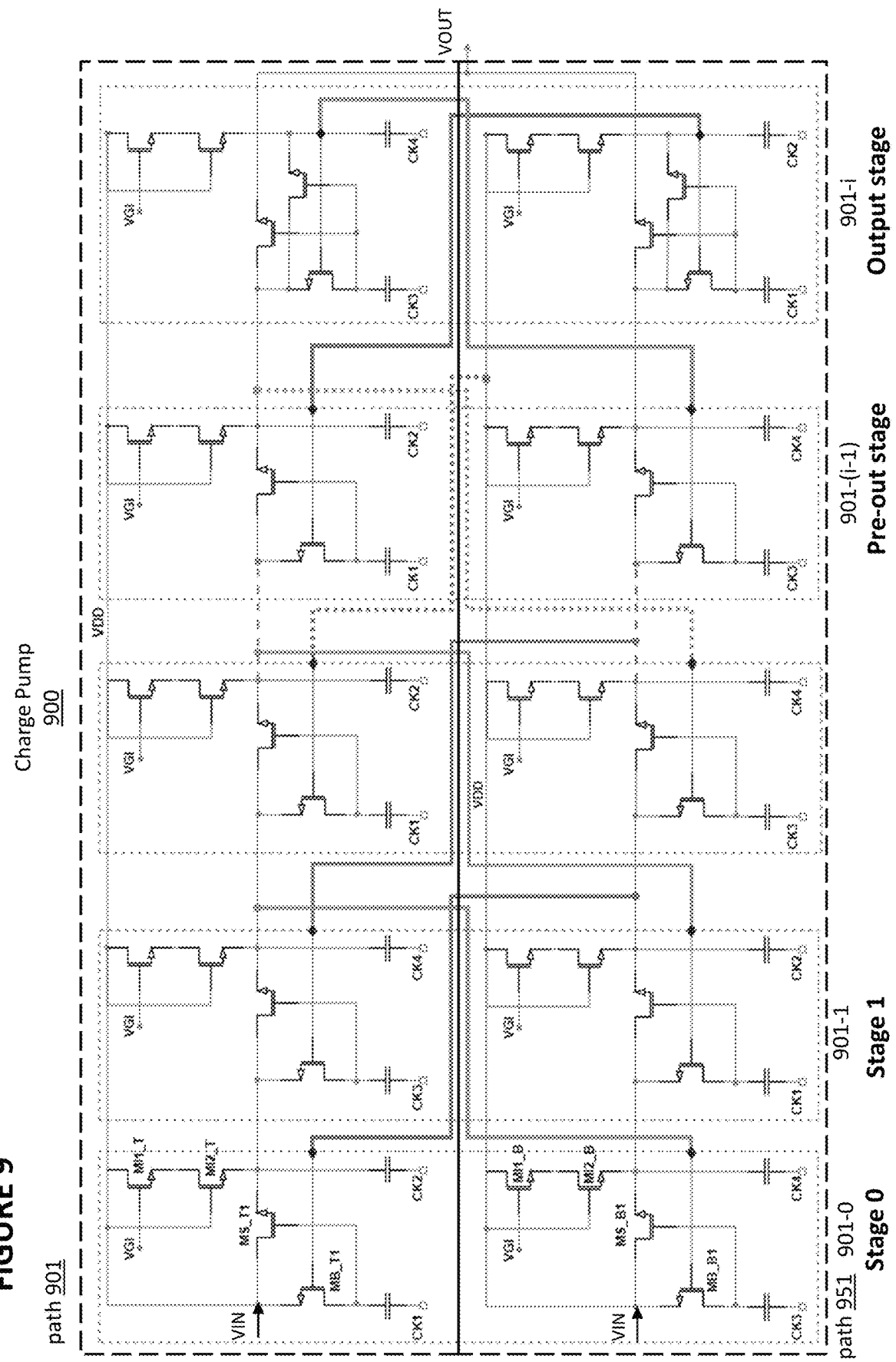
FIG. 9 depicts a charge pump.
Figure 10:
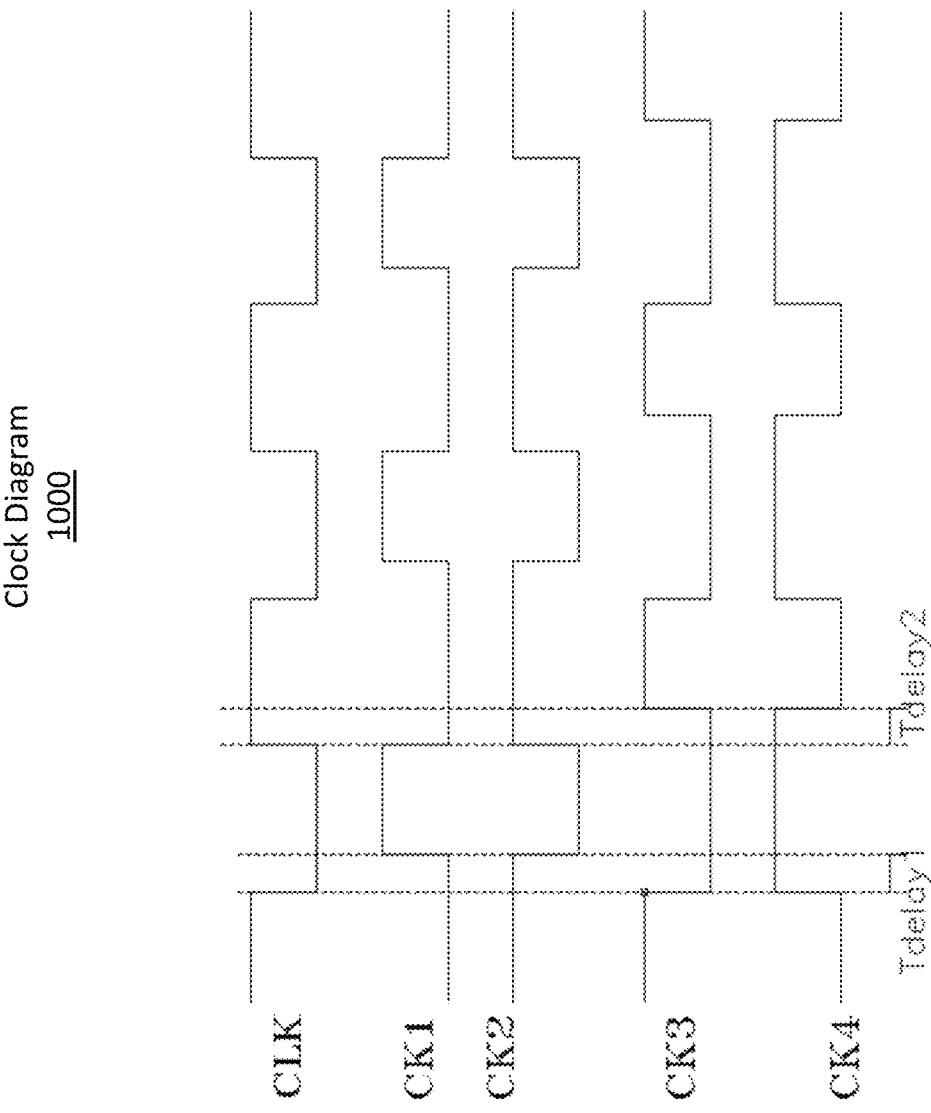
FIG. 10 depicts a clocking scheme for the charge pump of FIG. 9.

FIG. 9 depicts charge pump 900. Charge pump 900 comprises i+1 stages, which are stages 901-0 (stage 0), 901-1 (stage 1), . . . , 901-(i−1) (pre-out stage), and 901-i (output stage). Charge pump 900 also comprises a dual path, specifically, path 901 and 951. Each stage within a path can be referred to as a boost stage. Each boost stage boosts its received input voltage and outputs the boosted voltage to the next stage as the input voltage for the next stage, or in the case of stage 901-i, as the output Vout of charge pump 900. Paths 901 and 951 operate out of phase with one another, such that the output, Vout, is always at the maximum boosted voltage. FIG. 10 depicts examples of clock timing diagrams for CK1, CK2, CK3, and CK4 used in charge pump 900. Clocks signals CK1, CK2, CK3, and CK4 are generated from a common clock signal, denoted CLK. Clock signals CK1 and CK2 are complements of each other, and clock signals CK3 and CK4 are complements of each other. A respective first edge of clock signals CK1 and CK2 are delayed from a respective first edge of common clock signal CLK by an amount Tdelay1, and a respective second edge of clock signals CK1 and CK2 are aligned with a respective second edge of common clock signal CLK. A respective first edge of clock signals CK3 and CK4 are aligned with a respective first edge of common clock signal CLK and a respective second edge of clock signals CK3 and CK4 are delayed from a respective second edge of common clock signal CLK by an amount Tdelay2. Charge pump 900 improves against the body effect compared to prior art charge pump 600, as discussed in greater detail below with reference to FIG. 11.

Figure 11:
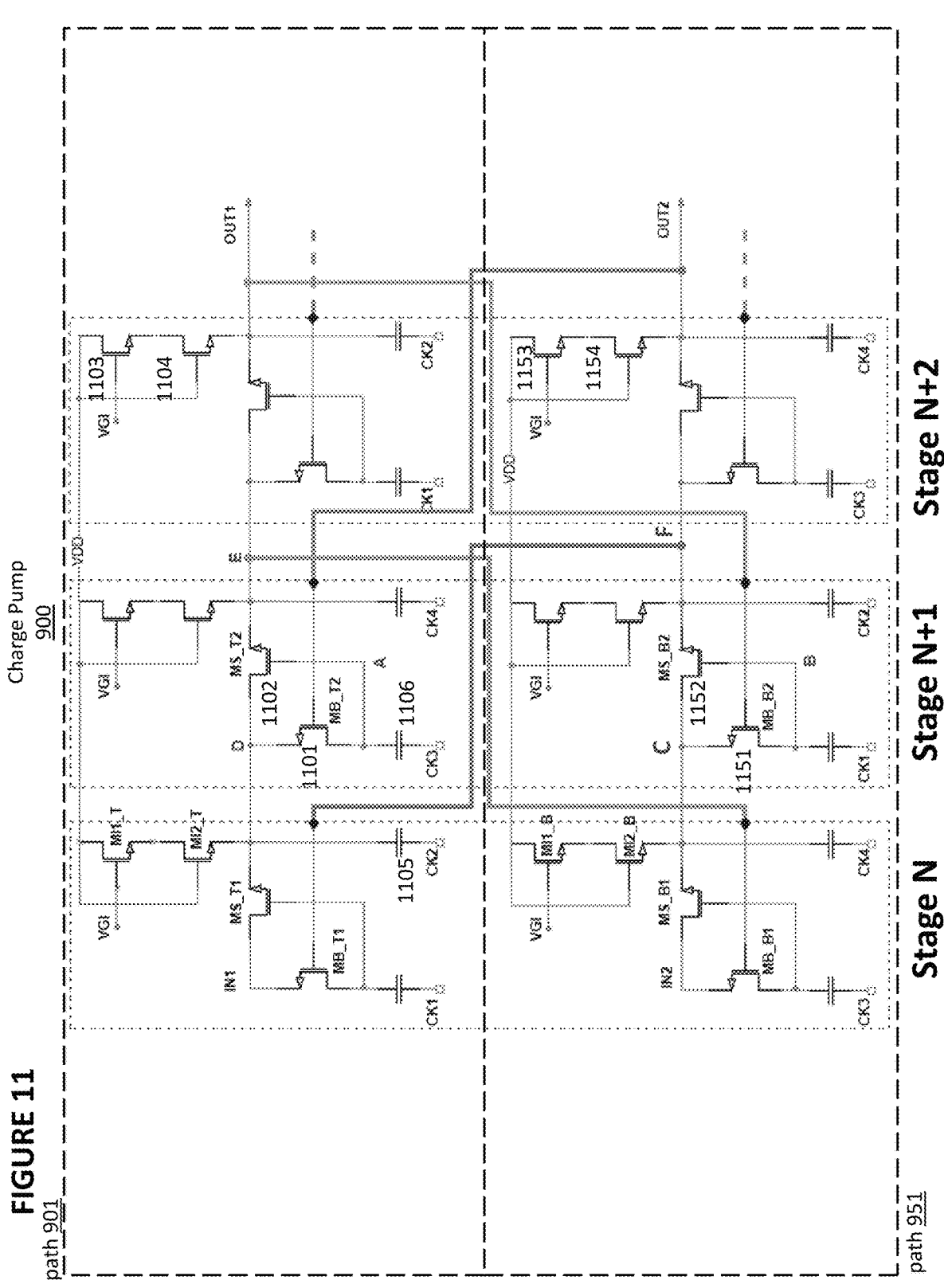
FIG. 11 depicts a simplified diagram of the charge pump of FIG. 6.

FIG. 11 depicts three example stages, stages N, N+1 and N+2 (where N ranges from 0 to (i−1) corresponding to stages 901-0, . . . , 901-i in FIG. 9) for paths 901 and 951 in charge pump 900. Respective boost stages in respective paths in charge pump 900 perform the boost operation in the same manner, which will explained with reference to boost stage corresponding to stage N in path 901. Node D is the input voltage received by stage N+1 in path 901. CK2 and CK3 are clock signals as shown in FIG. 10 and are coupled to capacitors 1105 and 1106, respectively. When CK2 goes high, the voltage on the top plate of capacitor 1105, which is node D, is boosted by the amount of the voltage by which CK2 increased. There is a delay period, Tdelay2, between a rising edge of CK2 and a rising edge of CK3 as shown in FIG. 10, and this delay will utilize a higher potential on node D to pre-charge node A through MB_T2 by the amount of OUT2 minus $V_{TH}$ of MB_T2. Thereafter, CK3 goes high, and the voltage on the top plate of capacitor 1106, which is node A, is boosted by the amount of the voltage by which CK3 increased. Consequently, the potential at node A now is equal to an amount of the voltage boosted from CK3 plus an amount of voltage from the pre-charge time, and the charge from node D to node E now can pass more effectively due to the boosted voltage on node A.

Figure 1:
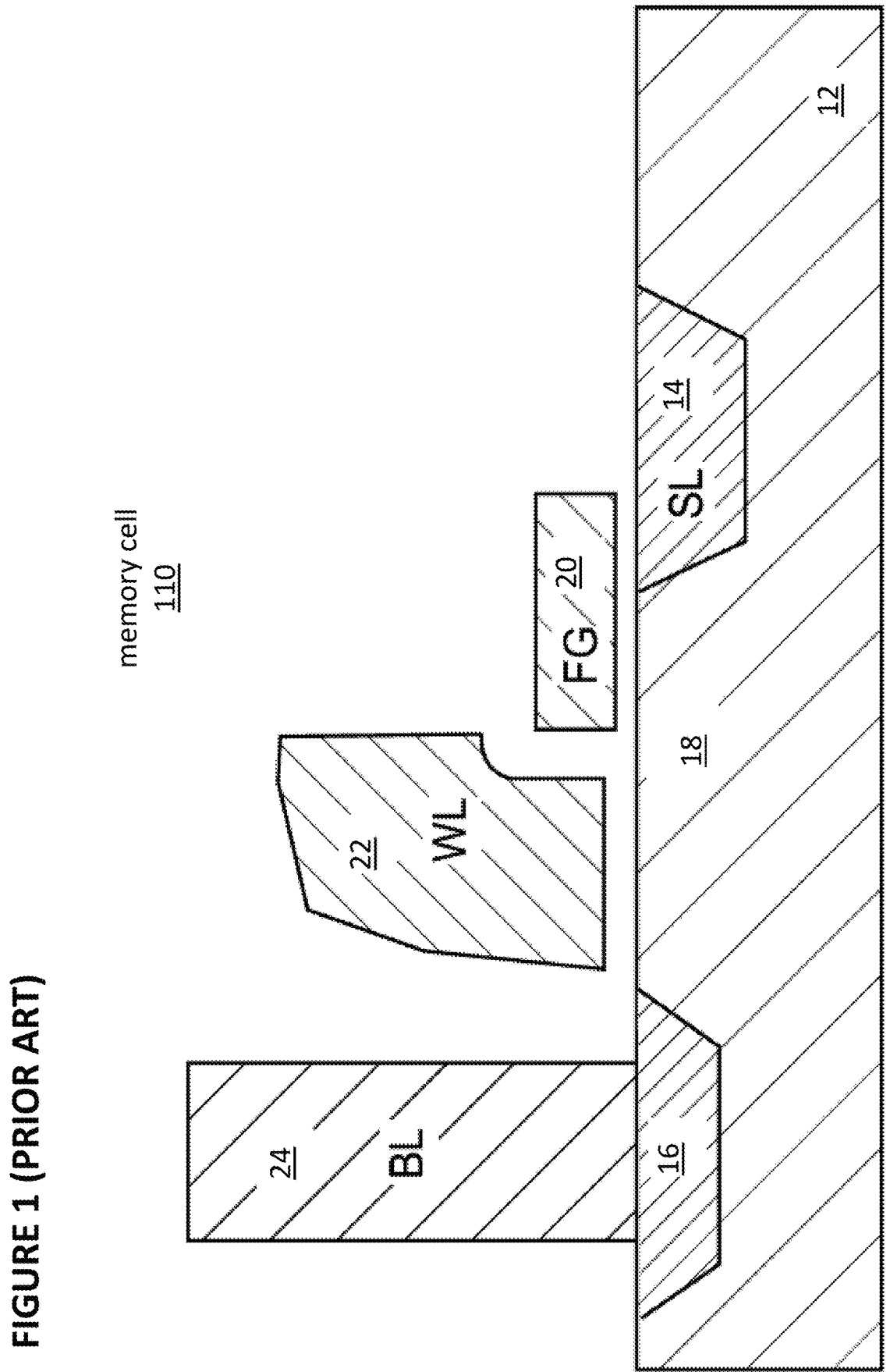
FIG. 1 depicts a prior art split gate flash memory cell.
Figure 2:
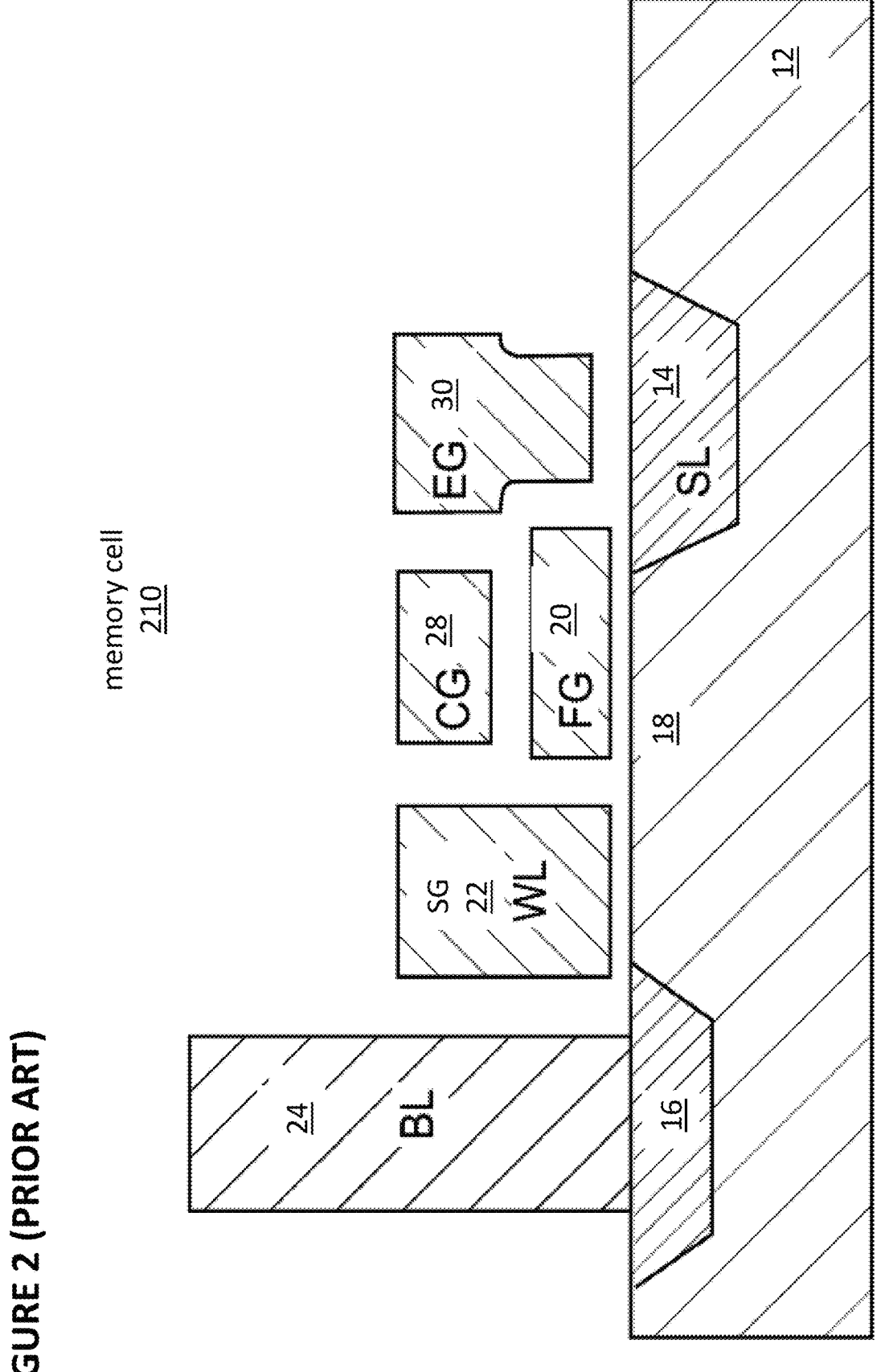
FIG. 2 depicts another prior art split gate flash memory cell.
Figure 3:
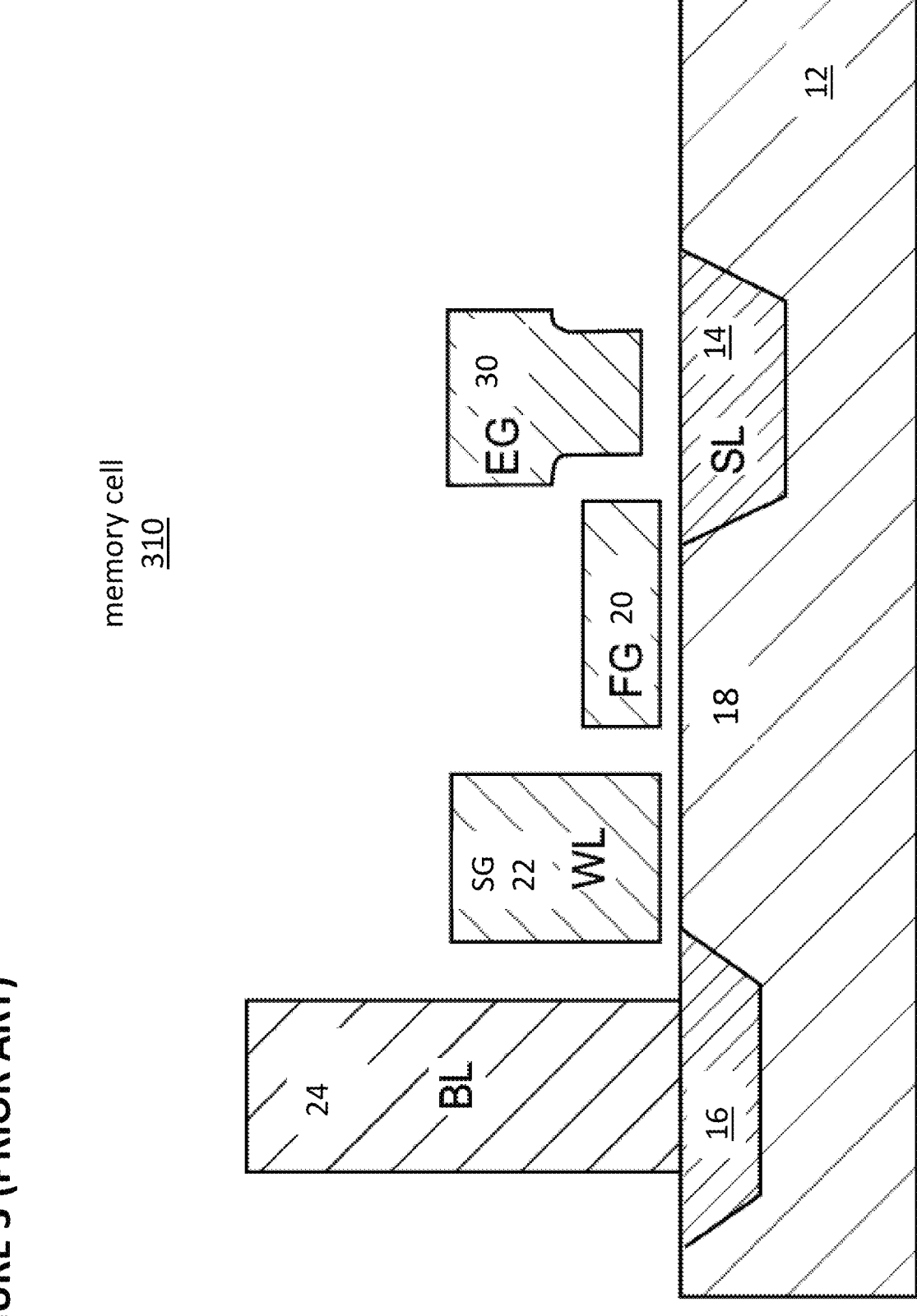
FIG. 3 depicts another prior art split gate flash memory cell.
Figure 4:
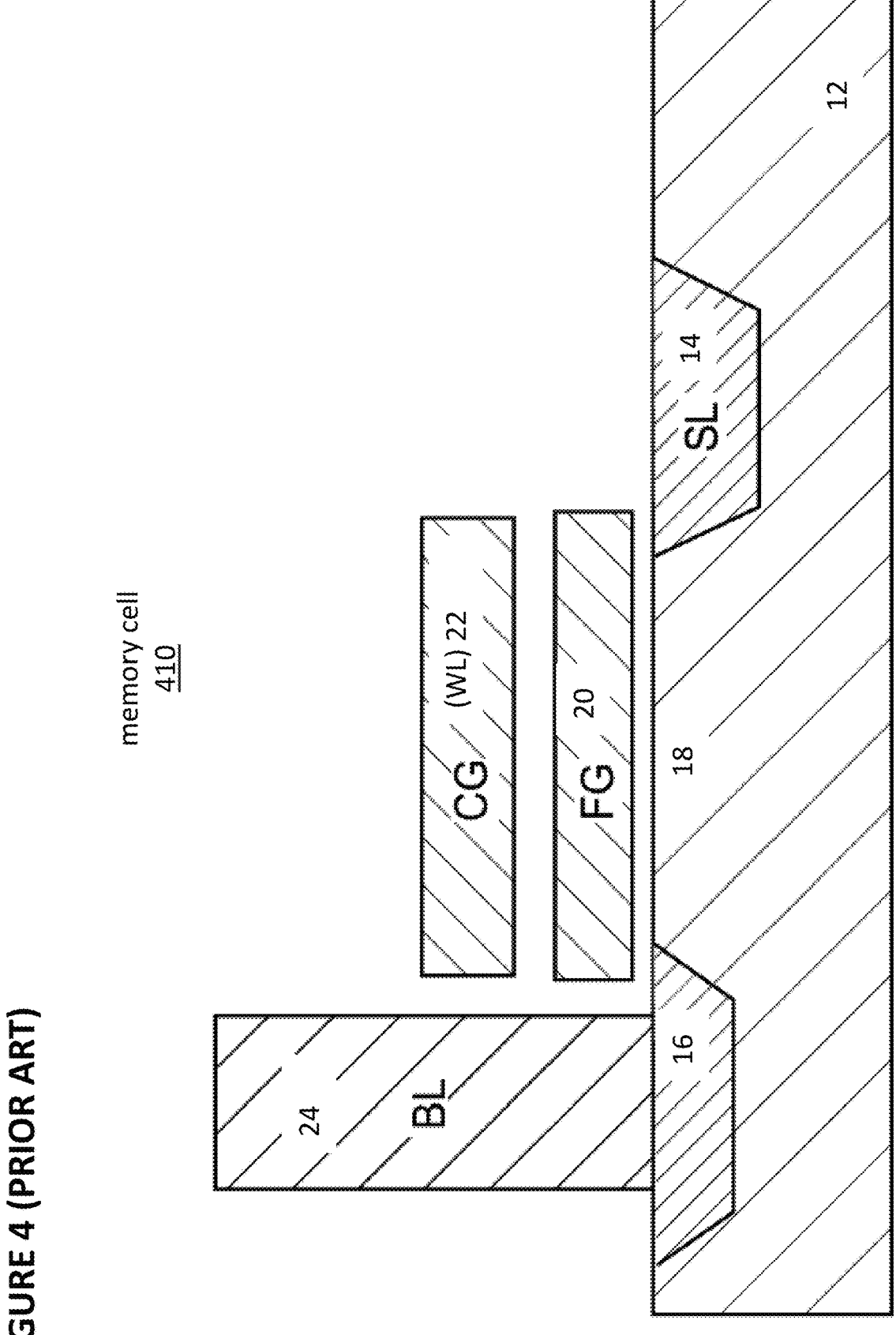
FIG. 4 depicts another prior art split gate flash memory cell.
Figure 5:
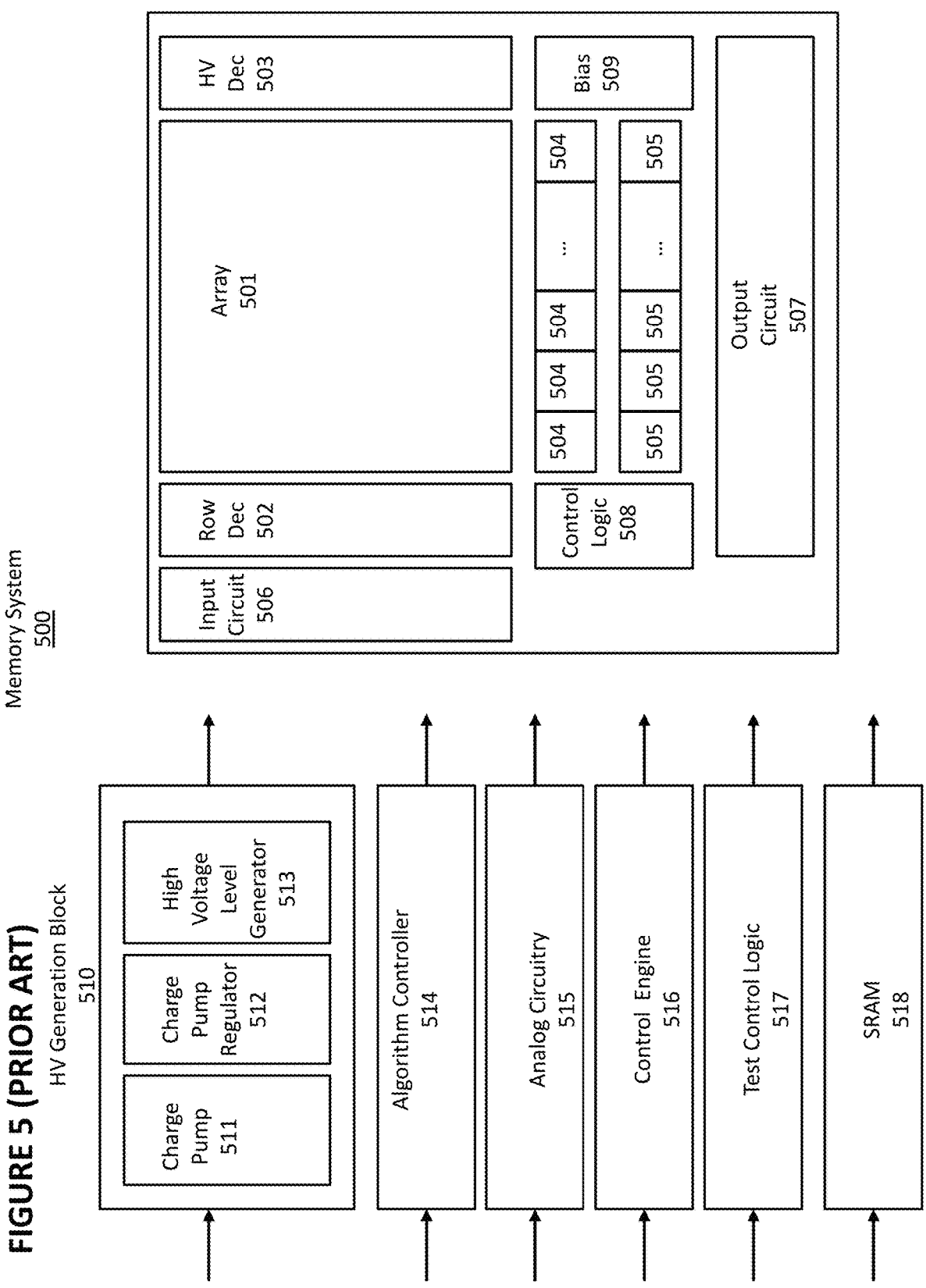
FIG. 5 depicts a prior art memory system.
Figure 6:
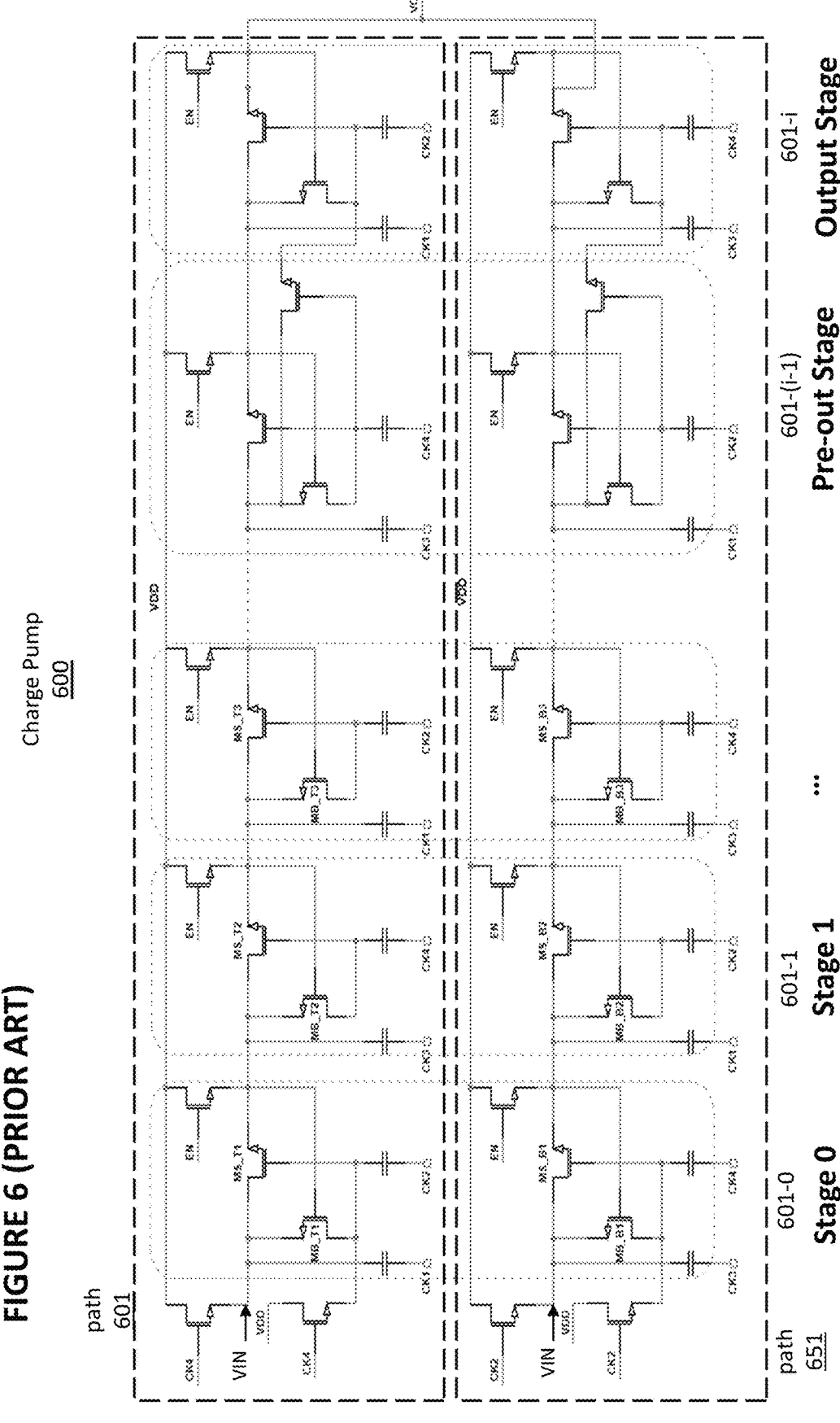
FIG. 6 depicts a prior art charge pump.
Figure 7:
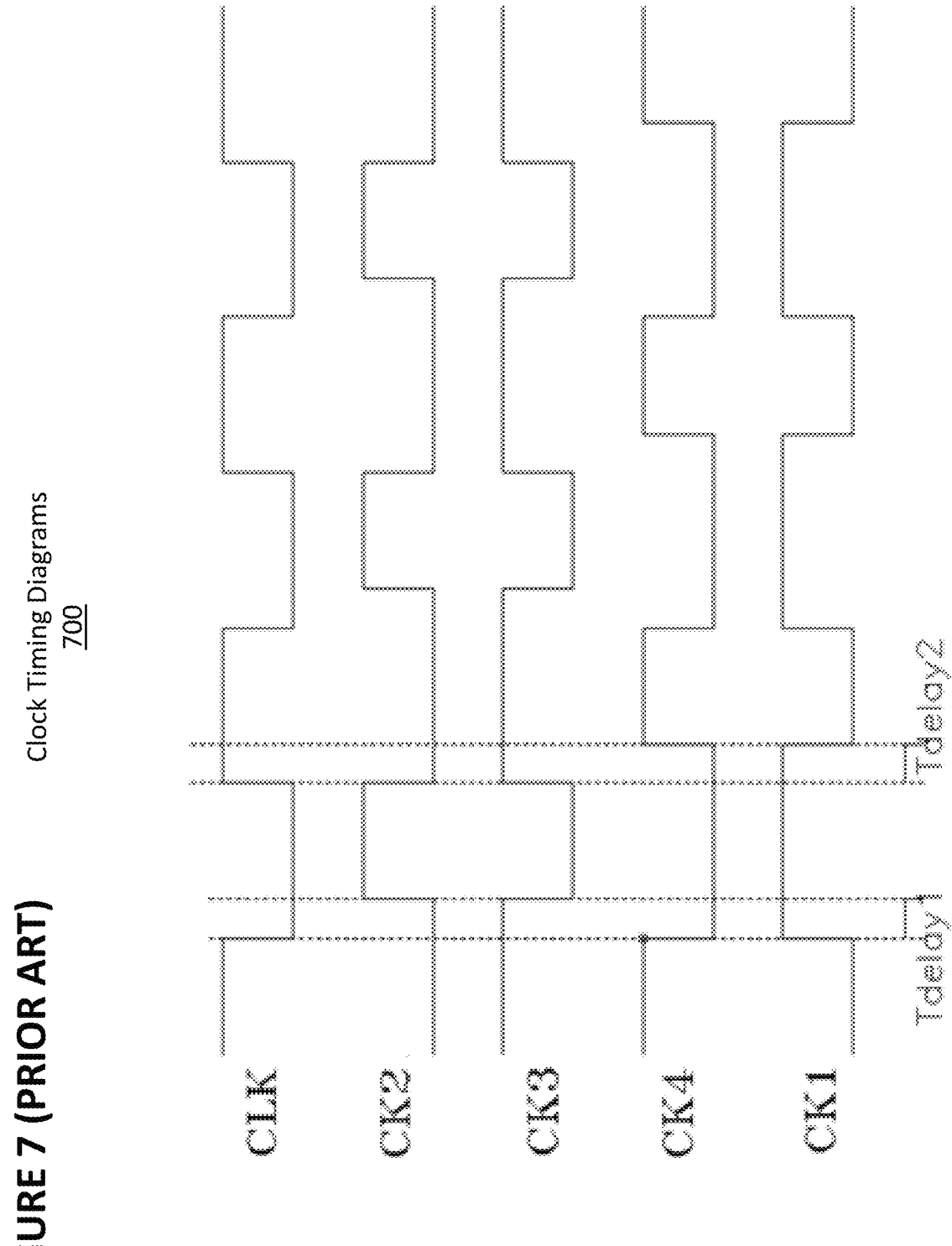
FIG. 7 depicts a clocking scheme for the prior art charge pump of FIG. 6.
Figure 8:
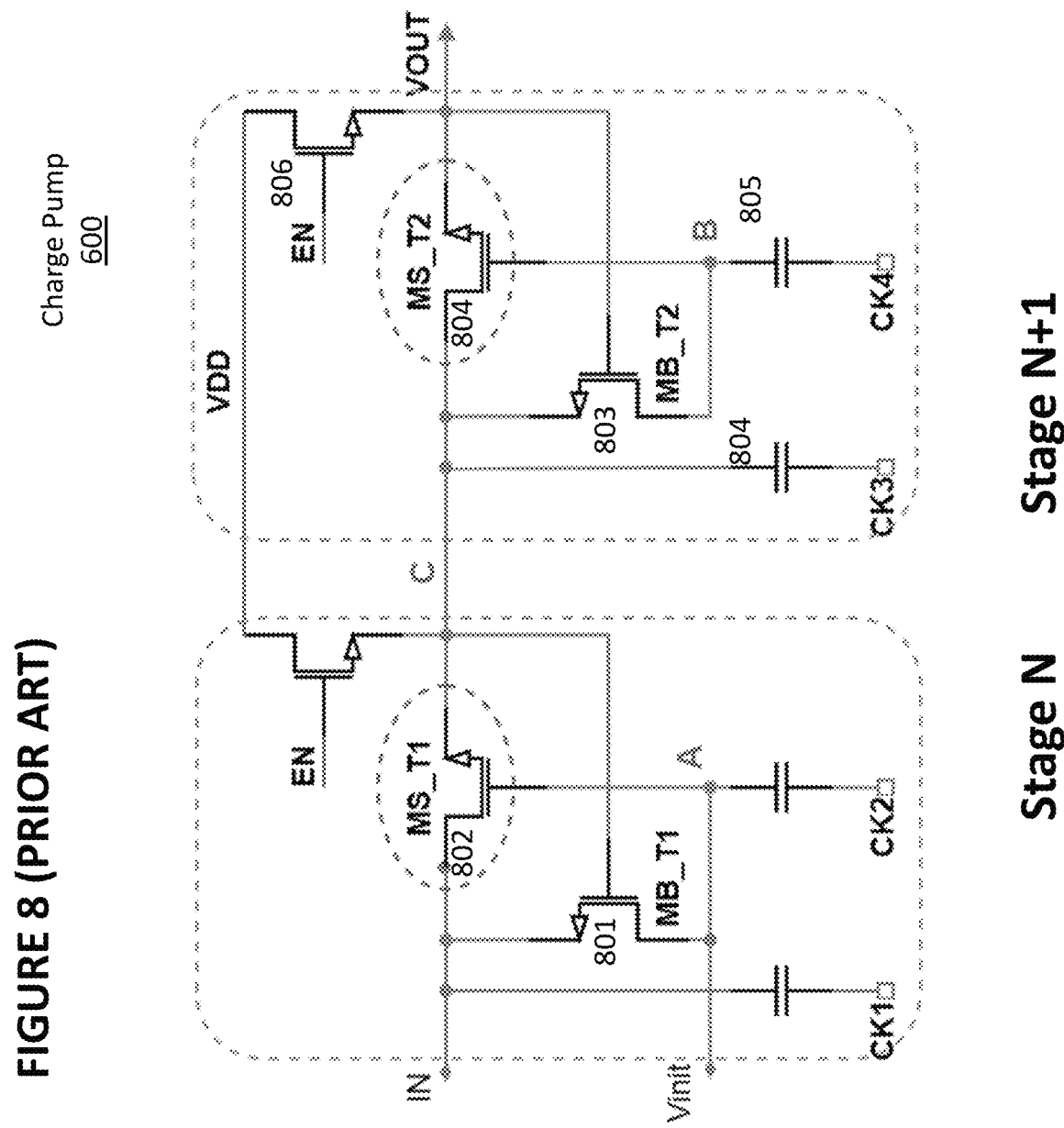
FIG. 8 depicts a simplified diagram of the prior art charge pump of FIG. 6.

Referring back to FIG. 8, transistor 806 can be enabled to place VOUT at an initial voltage of VDD, or it can remain enabled throughout operation of charge pump 600 to provide a floor for the value of VOUT (VOUT will always be equal to or exceed VDD).

Stage N+2 in path 901, or charge pump 900, comprises native NMOS transistor 1103 (a first native NMOS transistor) and native NMOS transistor 1104 (a second native NMOS transistor), which have lower threshold voltages that NMOS transistor 806 used in prior art charge pump 600. The use of native NMOS transistors 1103 and 1104 instead of NMOS transistors allows for a high initial voltage to be placed on OUT1 and similar nodes in other stages, which allows charge pump 900 to hit its target faster. In addition, the signal VGI provides a gating signal to native NMOS transistor 1103 and may turn off native NMOS transistor 1103 right after charge pump 900 is activated, to reduce the chance of significant leakage due to the low threshold voltage of native NMOS transistor 1103. Native NMOS transistor 1104 is provided to reduce stress on native NMOS transistor 1103, as the voltage difference between the source and gate of native NMOS transistor 1103 will be relatively large (HV−0V) when charge pump 900 is activated, where HV is the high voltage generated by the charge pump.

Native NMOS transistors 1153 (a third native NMOS transistor) and 1154 (a fourth native NMOS transistor) play the same role in stage N+1 of path 951 as does native NMOS transistors 1103 and 1104 in stage N+1 of path 901. The other pump stages of charge pump 900 contain native NMOS transistors that play the same role, as shown in FIGS. 9 and 11.

To overcome the body effect on boost transistors 1101 (MB_T2) (which is a first boost transistor) and 1151 (MB_B2) (which is a second boost transistor), charge pump 900 applies higher voltages to the gates of those transistors than in prior art charge pump 600. Specifically, charge pump 900 uses the output voltage from path 951 of stage N+2 (node OUT2) as the gate voltage for transistor 1101 (MB_T2) in stage N+1 of path 901 and the output voltage from path 901 of stage N+2 (node OUT1) as the gate voltage for transistor 1151 (MB_B2) in stage N+1 of path 951. Due to the boost provided by the subsequent stage, the gate voltages for transistors 1101 (MB_T2) and 1151 (MB_B2) are larger than would be the case in prior art charge pump 600, and node A and node B, respectively, can be pre-charged to a higher level than would be the case in prior art charge pump 600, which means that the gate voltages of transistors 1102 (MS_T2) and 1152 (MS B2) after boosted by CK3 and CK1, respectively, would be higher than would be the case in prior art charge pump 600, so that they are able to deal with the increased $V_{TH}$ after the body effect. As a result, the boosting is more effective in charge pump 900 than in prior art charge pump 600. Charge pump 900 is able to provide a higher output voltage than charge pump 600, with higher efficiency and lower process-temperature variation.

The boost stages of charge pump 900 can operate to perform a method comprising boosting a first voltage (the voltage at node D), by a first stage (stage N+1) in a first charge path (path 901), to generate a second voltage (the voltage at node E); boosting the second voltage, by a second stage (stage N+2) in the first charge path (path 901), to generate a third voltage (the voltage OUT1); boosting a fourth voltage (the voltage at node C), by a first stage (stage N+1) in a second charge path (path 951), to generate a fifth voltage (the voltage at node F); boosting the fifth voltage, by a second stage (stage N+2) in the second charge path (path 951), to generate a sixth voltage (the voltage OUT2); applying the third voltage to the first stage of the second charge path; and applying the sixth voltage to the first stage of the first charge path; wherein applying the sixth voltage to the first stage of the first charge path comprises applying the sixth voltage to a gate of a first boost transistor (1101) in the first stage of the first charge path and applying the third voltage to the first stage of the second charge path comprises applying the third voltage to a gate of a second boost transistor (1151) in the first stage of the second charge path. The method can further comprise applying a first clock signal (CK3) to the first stage of the first charge path and the second stage of the second charge path; applying a second clock signal (CK4) to the first stage of the first charge path and the second stage of the second charge path; applying a third clock signal (CK1) to the first stage of the second charge path and the second stage of the first charge path; and applying a fourth clock signal (CK2) to the first stage of the second charge path and the second stage of the first charge path.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A system comprising:
   a first charge path comprising a first stage comprising a first boost transistor and a first pass transistor and a second stage comprising a second boost transistor and a second pass transistor, wherein the first stage of the first charge path boosts an input voltage and the second stage of the first charge path boosts a voltage received from the first stage of the first charge path; and
   a second charge path comprising a first stage comprising a third boost transistor and a third pass transistor and a second stage comprising a fourth boost transistor and a fourth pass transistor, wherein the first stage of the second charge path boosts an input voltage and the second stage of the second charge path boosts a voltage received from the first stage of the second charge path;
   wherein an output of the second stage of the first charge path is coupled to a gate of the third boost transistor and an output of the second stage of the second charge path is coupled to a gate of the first boost transistor.

2. The system of claim 1, wherein the boost transistor in the first stage of the first charge path is an NMOS transistor.

3. The system of claim 2, wherein the boost transistor in the first stage of the second charge path is an NMOS transistor.

4. The system of claim 1, wherein the first stage of the first charge path and the second stage of the second charge path receive a first clock signal and a second clock signal.

5. The system of claim 4, wherein the first stage of the second charge path and the second stage of the first charge path receive a third clock signal and a fourth clock signal.

6. The system of claim 5, wherein the first clock signal and the second clock signal are complementary clock signals.

7. The system of claim 6, wherein the third clock signal and the fourth clock signal are complementary clock signals.

8. The system of claim 1, wherein the second stage in the first charge path comprises:
   a first native NMOS transistor comprising a first terminal coupled to a supply voltage, a second terminal, and a gate for receiving a control signal; and
   a second native NMOS transistor comprising a first terminal coupled to the second terminal of the first native NMOS transistor, a second terminal coupled the output of the second stage of the first charge path, and a gate coupled to the supply voltage.

9. The system of claim 8, wherein the second stage in the second charge path comprises:

a third native NMOS transistor comprising a first terminal coupled to a supply voltage, a second terminal, and a gate for receiving a control signal; and a fourth native NMOS transistor comprising a first terminal coupled to the second terminal of the first native NMOS transistor, a second terminal coupled the output of the second stage of the second charge path, and a gate coupled to the supply voltage.

10. A method comprising:

boosting a first voltage, by a first stage in a first charge path, to generate a second voltage, the first stage in the first charge path comprising a first boost transistor and a first pass transistor;

boosting the second voltage, by a second stage in the first charge path, to generate a third voltage;

boosting a fourth voltage, by a first stage in a second charge path, to generate a fifth voltage, the first stage in the second charge path comprising a second boost transistor and a second pass transistor;

boosting the fifth voltage, by a second stage in the second charge path, to generate a sixth voltage;

applying the third voltage to a gate of the second boost transistor in the first stage of the second charge path; and applying the sixth voltage to a gate of the first boost transistor in the first stage of the first charge path.

11. The method of claim 10, wherein the second boost transistor is an NMOS transistor.

12. The method of claim 11, wherein the first boost transistor is an NMOS transistor.

13. The method of claim 12, comprising:

applying a first clock signal to the first stage of the first charge path and the second stage of the second charge path; and applying a second clock signal to the first stage of the first charge path and the second stage of the second charge path.

14. The method of claim 13, comprising:

applying a third clock signal to the first stage of the second charge path and the second stage of the first charge path; and applying a fourth clock signal to the first stage of the second charge path and the second stage of the first charge path.

15. The method of claim 14, wherein the first clock signal and the second clock signal are complementary clock signals.

16. The method of claim 15, wherein the third clock signal and the fourth clock signal are complementary clock signals.

17. A system comprising:

a first charge path comprising $(i+1)$ boost stages, where $i>1$, each of the boost stages in the first charge path comprising a boost transistor and a pass transistor; and a second charge path comprising $(i+1)$ boost stages, each of the boost stages in the second charge path comprising a boost transistor and a pass transistor;

wherein the first charge path and the second charge path receive an input voltage and generate an output voltage greater than the input voltage; and wherein an output of boost stage $(N+1)$ of the first charge path is coupled to a gate of the boost transistor of boost stage N of the second charge path and an output of boost stage $(N+1)$ of the second charge path is coupled to a gate of the boost transistor of boost stage N of the first charge path, where $1 \leq N \leq i$.

18. The system of claim 17, comprising:

a first clock signal and a second clock signal provided to the first charge path, wherein the first clock signal and the second clock signal are complementary clock signals; and a third clock signal and a fourth clock signal provided to the second charge path, wherein the third clock signal and the fourth clock signal are complementary clock signals.

* * * * *